United States Patent
Yasugahira et al.

(10) Patent No.: US 12,381,456 B2
(45) Date of Patent: Aug. 5, 2025

(54) ELECTRIC DEVICE INCLUDING STATIC-REMOVING GROUNDING PATH

(71) Applicant: MIKUNI CORPORATION, Tokyo (JP)

(72) Inventors: Kei Yasugahira, Iwate (JP); Rui Yoshida, Iwate (JP)

(73) Assignee: MIKUNI CORPORATION, Tokyo (JP)

(*) Notice: Subject to any disclaimer, the term of this patent is extended or adjusted under 35 U.S.C. 154(b) by 32 days.

(21) Appl. No.: 18/594,018

(22) Filed: Mar. 4, 2024

(65) Prior Publication Data

US 2024/0392778 A1 Nov. 28, 2024

(30) Foreign Application Priority Data

May 26, 2023 (JP) ................................. 2023-087050

(51) Int. Cl.
*H02K 11/40* (2016.01)
*F04C 2/10* (2006.01)
(Continued)

(52) U.S. Cl.
CPC ............... *H02K 11/40* (2016.01); *F04C 2/10* (2013.01); *F04C 2/102* (2013.01); *H02K 5/04* (2013.01); *H02K 11/0141* (2020.08); *H05K 1/0215* (2013.01); *H05K 1/0224* (2013.01); *H05K 1/0225* (2013.01); *H05K 1/18* (2013.01); *F04C 2240/30* (2013.01); *F04C 2240/803* (2013.01); *F04C 2240/808* (2013.01); *H05K 2201/10189* (2013.01); *H05K 2201/10409* (2013.01)

(58) Field of Classification Search
CPC .................. H02K 11/40; H05K 1/0215–0227
See application file for complete search history.

(56) References Cited

U.S. PATENT DOCUMENTS

2017/0303389 A1* 10/2017 Motohashi ........... H05K 5/0065
2019/0053368 A1* 2/2019 Motohashi ............. H02K 11/33
(Continued)

FOREIGN PATENT DOCUMENTS

CN 111404328 A * 7/2020 ........... B60H 1/3222
DE 102017102987 A1 * 8/2018
(Continued)

*Primary Examiner* — Laert Dounis
(74) *Attorney, Agent, or Firm* — JCIPRNET

(57) ABSTRACT

An electric device includes: an electric part 50, operating electrically; a housing body 10, being conductive and accommodating the electric part; a holder cover 20, covering the electric part accommodated in the housing body, being non-conductive and bonded to the housing body to hold a portion of the electric part; and a circuit substrate 70 disposed on an outer side of the holder cover and mounted with a control unit 76 exerting driving control on the electric part; and a grounding path, removing static electricity charged to a periphery of the electric part. The grounding path includes: a fastening screw 80*a*, fastening the circuit substrate to the holder cover and being conductive to the housing body; a conductive pattern 72*a*, provided in the circuit substrate and being conductive to the fastening screw; and a grounding terminal 29*d*, provided in the holder cover and being conductive to the conductive pattern 72*a*.

16 Claims, 14 Drawing Sheets

(51) Int. Cl.
   *H02K 5/04*       (2006.01)
   *H02K 11/01*      (2016.01)
   *H05K 1/02*       (2006.01)
   *H05K 1/18*       (2006.01)

(56)              References Cited

U.S. PATENT DOCUMENTS

2021/0313864  A1*  10/2021  Zhang .................... H02K 11/40
2024/0213859  A1*   6/2024  Kataoka ................. H02K 5/225

FOREIGN PATENT DOCUMENTS

JP         H0787696   A   *   3/1995
JP         2014136975         7/2014
JP         2017204954        11/2017
WO      WO-2007142173  A1  * 12/2007   ........... H05K 9/0067

* cited by examiner

ELECTRIC DEVICE INCLUDING STATIC-REMOVING GROUNDING PATH

CROSS-REFERENCE TO RELATED APPLICATION

This application claims the priority benefit of Japan application no. 2023-087050, filed on May 26, 2023. The entirety of the above-mentioned patent application is hereby incorporated by reference herein and made a part of this specification.

BACKGROUND

Technical Field

The invention relates to an electric device including a grounding path that removes static electricity charged to a housing accommodating an electric part, such as a motor, or a circuit substrate, and particularly relates to an electric device including a grounding path removing static electricity charged to a housing for an electric pump, etc.

Description of Related Art

As a conventional electric device, a pump device is known (see Patent Documents 1 and 2, for example). Such pump device includes: a pump body, as a housing body formed by a conductive metallic material; a stator module, formed by resin molding, including a rotor and a stator, and bonded to the pump body; a fastening bolt, fastening the stator module to the pump body; a cover body, bonded to the stator module; a coil spring, interposed between the fastening bolt and the cover body; a circuit substrate, accommodated between the stator module and the cover body; a conductive member, interposed between the cover body and a conductive pattern on the circuit substrate; and a connector terminal, connected with the conductive pattern on the circuit substrate. A grounding path (neutralizing path) removing static electricity charged to the pump body, etc., is formed by the pump body, the fastening bolt, the coil spring, the cover body, the conductive member, the conductive pattern of the circuit substrate, and the connector terminal (see, for example, Patent Documents 1, 2)

In the conventional electric device, the grounding path extends from the housing body to the fastening bolt and the coil spring, passes through the cover body, and extends from the conductive pattern on the circuit substrate to the connector terminal via the conductive member. Therefore, the number of components forming the grounding path is large, the structure is complicated, and the grounding path is very long. As a result, the grounding path may become a reason why noise occurs for a control unit including electronic components, etc., on the circuit substrate.

Prior Art Document(s)

Patent Document

[Patent Document 1] Japanese Laid-open No. 2014-136975
[Patent Document 2] Japanese Laid-open No. 2017-204954

The invention has been made in view of the above issues, and an objective of the invention is to provide an electric device capable of reducing a grounding path and suppressing noise, etc., with respect to the control unit from occurring, while simplifying the structure, reducing the number of components, and reducing the cost, etc.

SUMMARY

An electric device according to the invention includes: an electric part, operating electrically; a housing body, being conductive and accommodating the electric part; a holder cover, covering the electric part accommodated in the housing body and being non-conductive and bonded to the housing body, so as to hold a of the electric part; a circuit substrate, which is disposed on an outer side of the holder cover and on which a control unit exerting driving control on the electric part is mounted; and a grounding path, removing static electricity charged to a periphery of the electric part. The grounding path includes: a fastening screw, fastening the circuit substrate to the holder cover and being conductive to the housing body; a conductive pattern, provided in the circuit substrate and being conductive to the fastening screw; and a grounding terminal, provided in the holder cover and being conductive to the conductive pattern.

DESCRIPTION OF THE EMBODIMENTS

Figure 1:
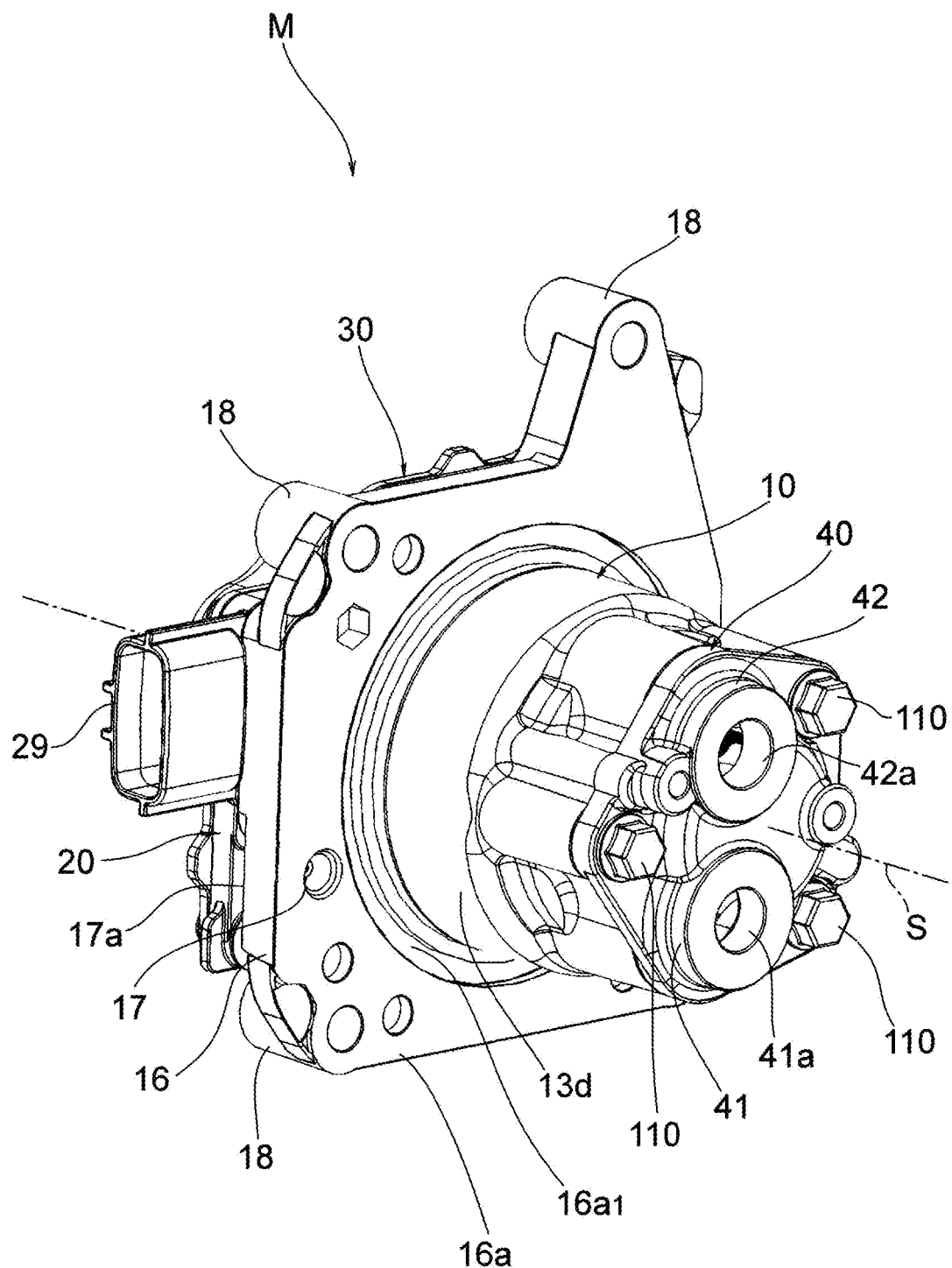
FIG. 1 is a perspective view illustrating the appearance of an electric device according to an embodiment of the invention.

An electric device according to the invention includes: an electric part, operating electrically; a housing body, being conductive and accommodating the electric part; a holder cover, covering the electric part accommodated in the housing body and being non-conductive and bonded to the housing body, so as to hold a portion of the electric part; a circuit substrate, which is disposed on an outer side of the holder cover and on which a control unit exerting driving control on the electric part is mounted; and a grounding path, removing static electricity charged to a periphery of the electric part. The grounding path includes: a fastening screw, fastening the circuit substrate to the holder cover and being conductive to the housing body; a conductive pattern, provided in the circuit substrate and being conductive to the fastening screw; and a grounding terminal, provided in the holder cover and being conductive to the conductive pattern.

In the electric device, it may also be configured that the fastening screw is electrically connected with the housing body via a coil spring that is conductive.

In the electric device, it may also be configured that the housing body includes a concave part in which an end of the coil spring is seated In the electric device, it may also be configured that the electric device includes a nut, being conductive and screwed onto the fastening screw, and the coil spring is disposed in a compressed state between the housing body and the nut.

In the electric device, it may also be configured that the electric device includes a nut, the housing body includes a concave part in which an end of the coil spring is seated, and the coil spring is disposed in a compressed state between the concave part of the housing body and the nut.

In the electric device, it may also be configured that the holder cover includes a nut accommodation concave part non-rotatably accommodating the nut In the electric device, it may also be configured that the circuit substrate is fastened to the holder cover by using fastening screws, and the fastening screw forming the grounding path is a fastening screw disposed at a position closest to the grounding terminal among the fastening screws.

In the electric device, it may also be configured that the fastening screw forming the grounding path is electrically connected with the conductive pattern via a through hole conductive to the conductive pattern or an annular land formed at an end of the through hole.

In the electric device, it may also be configured that an outer cover is bonded to the holder cover to cover the circuit substrate In the electric device, it may also be configured that the outer cover is formed by a conductive material and is fastened to the housing body by using a fastening bolt that is conductive.

In the electric device, it may also be configured that the electric part is a motor that generates a rotational driving force, the electric device includes a driven body driven by a driving shaft of the motor, and the housing body includes a driven body accommodation concave part accommodating the driven body.

In the electric device, it may also be configured that a driven body cover that is conductive is bonded to the housing body, so as to cover the driven body accommodation concave part.

In the electric device, it may also be configured that the driven body is a pump unit that causes a fluid flow, and the driven body accommodation concave part is a pump accommodation concave part.

In the electric device, it may also be configured that the pump unit includes a trochoid pump that includes an inner rotor and an outer rotor, the inner rotor being rotated by the driving shaft, and the outer rotor being linked with the inner rotor In the electric device, it may also be configured that a pump cover that is conductive is bonded to the housing body to cover the pump accommodation concave part.

In the electric device, it may also be configured that the pump cover includes a suction passage and a discharge passage, the suction passage sucking in the fluid, and the discharge passage discharging the fluid.

According to the electric device with the configuration, the grounding path can be reduced, and the noise, etc., with respect to the control unit can be suppressed from occurring, while the structure is simplified, the number of components is reduced, and the cost is reduced, etc.

In the following, the embodiments of the invention will be described with reference to the drawings.

Figure 2:
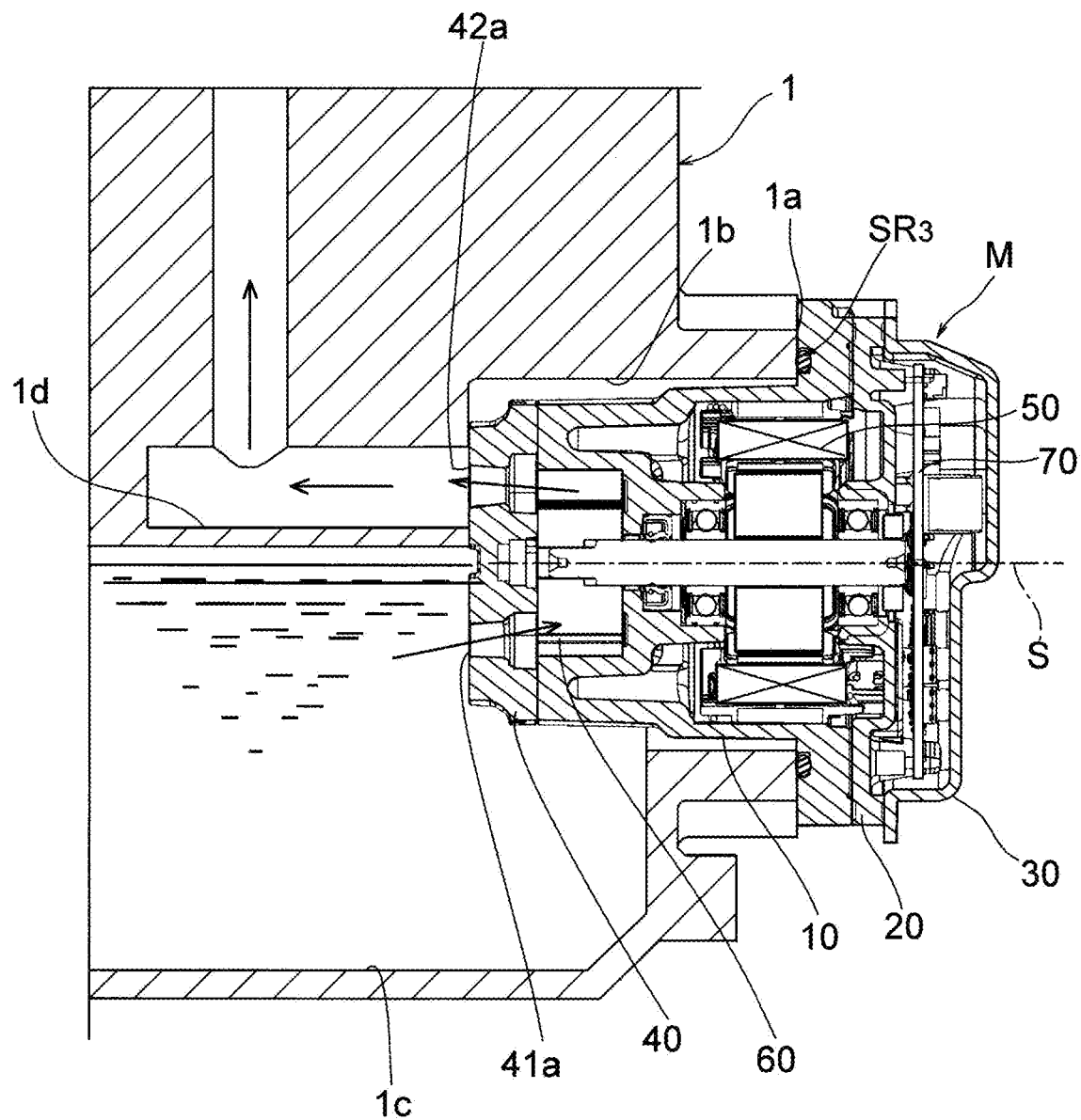
FIG. 2 is a cross-sectional view illustrating a state in which the electric device according to an embodiment is installed to an application target.
Figure 3:
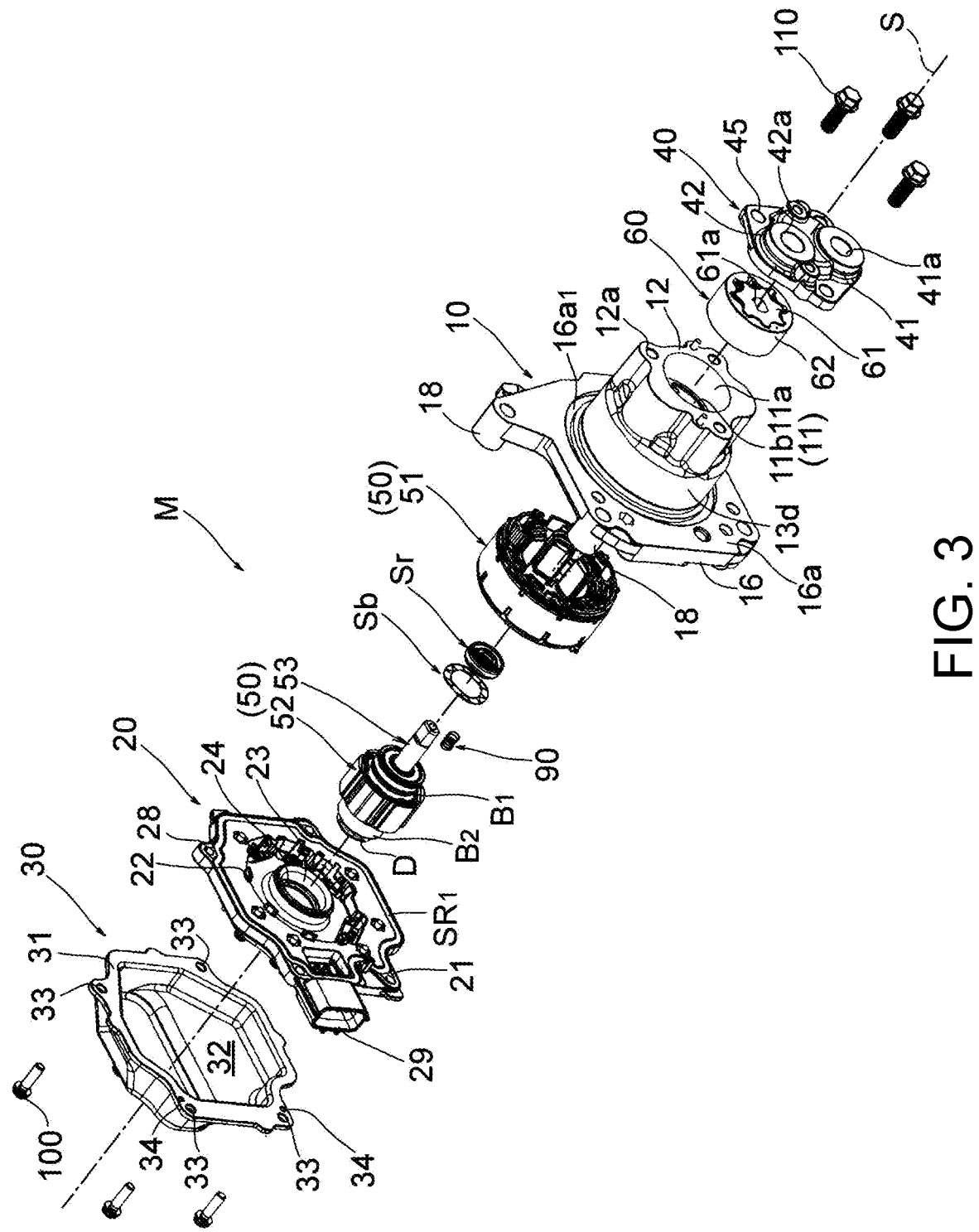
FIG. 3 is an exploded perspective view in which the electric device according to an embodiment is dissembled and viewed from a housing body side.

An electric device M according to an embodiment is a built-in electric pump device that discharges a non-conductive hydraulic oil as a fluid. As shown in FIGS. 1 to 3, the electric device M includes a housing body 10, a holder cover 20, an outer cover 30, a pump cover 40 as a driven body cover, a motor 50 as an electric part, a pump unit 60 as a driven body, a circuit substrate 70, six fastening screws 80 and nuts 81, a coil spring 90, four fastening bolts 100, and three fastening bolts 110. Here, the housing of the entire electric device M is formed by the housing body 10, the holder cover 20, the outer cover 30, and the pump cover 40.

Also, as shown in FIG. 2, an application target 1 to which the electric device M is applied includes a bonding part 1a forming a flat surface perpendicular of the electric device M to an axis S, a fitting concave part 1b, a hydraulic oil storage part 1c, and a guide passage 1d guiding hydraulic oil to a supply destination, and four screw holes (not shown) into which installation bolts are screwed.

The application target 1, for example, is a cooling and lubrication system of a transmission device of a vehicle, a cooling and lubrication system of an engine, or another device requiring circulating the hydraulic oil.

The housing body 10 is formed by a conductive material, such as a metallic material like steel, cast iron, sintered steel, aluminum alloy, etc. As shown in FIGS. 3, 4, 10, and 11, the housing body 10 includes a pump accommodation concave part 11 as a driven body accommodation concave body, a bonding surface 12, a motor accommodation concave part 13, a partition wall part 14, a fitting concave part 15, a flange part 16, a through hole 17, and four boss parts 18.

Figure 11:
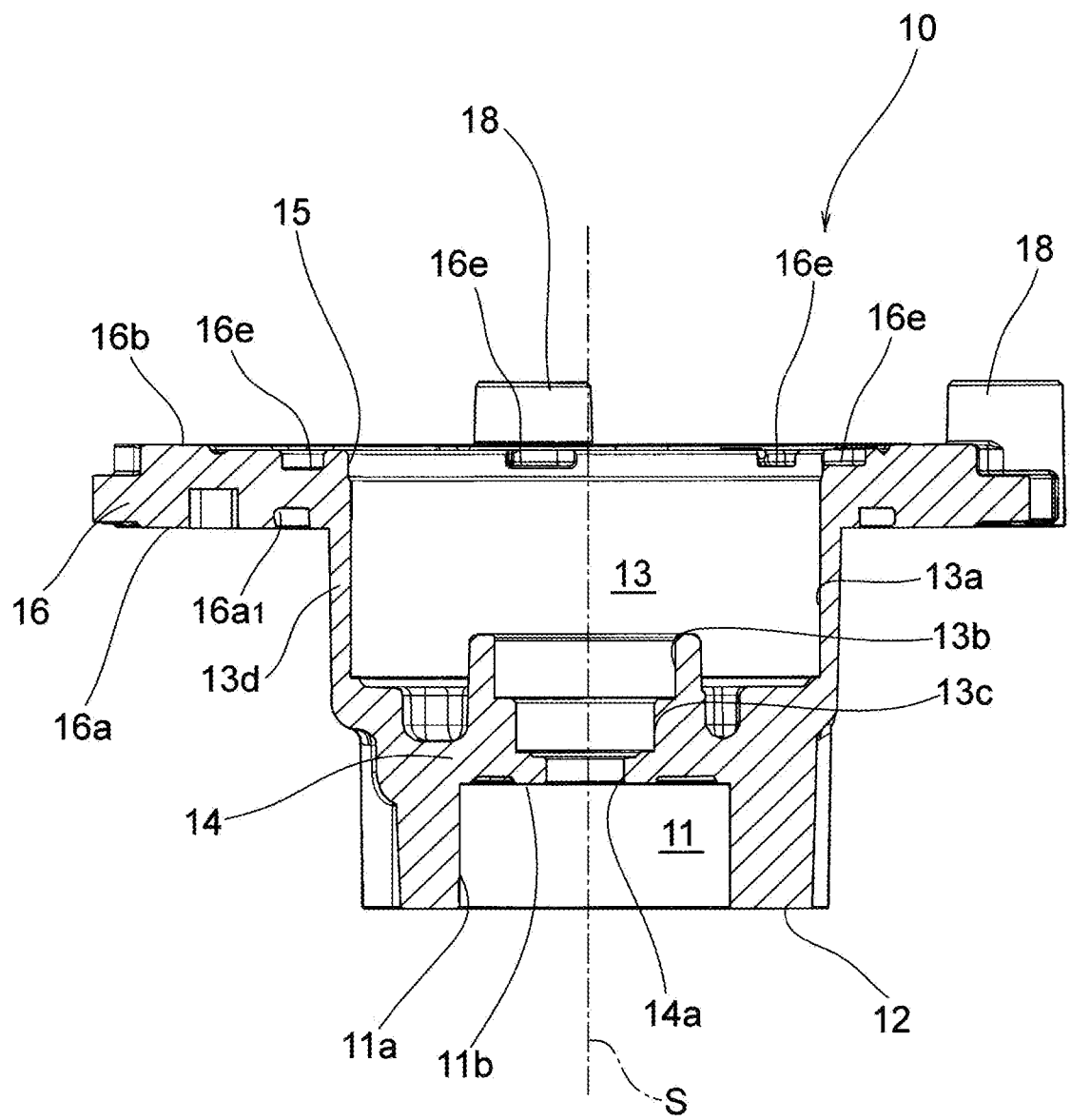
FIG. 11 is a cross-sectional view of the housing body included in the electric device according to an embodiment, the cross-sectional view being taken along a surface passing through the axis of the driving shaft.

The pump accommodation concave part 11 is a region rotatably accommodating the pump unit 60, and includes an inner circumferential surface 11a and a bottom surface 11b as shown in FIGS. 3 and 11.

The inner circumferential surface 11a forms a cylindrical surface with tan axis as the center, the axis being offset from the axis S in a parallel manner, and slidably supports the outer circumferential surface of an outer rotor 62 forming a portion of the pump unit 60.

In the direction of the axis S, the bottom surface 11b slidably receives the end surface on the inner side of the pump unit 60 (an inner rotor 61 and an outer rotor 62).

The bonding surface 12 is formed as an annular flat surface perpendicular to the axis S, so that the pump cover 40 covering the pump accommodation concave part 11 is bonded, and includes three screw holes 12a into which the fastening bolts 110 fastening the pump cover 40 are screwed.

Figure 10:
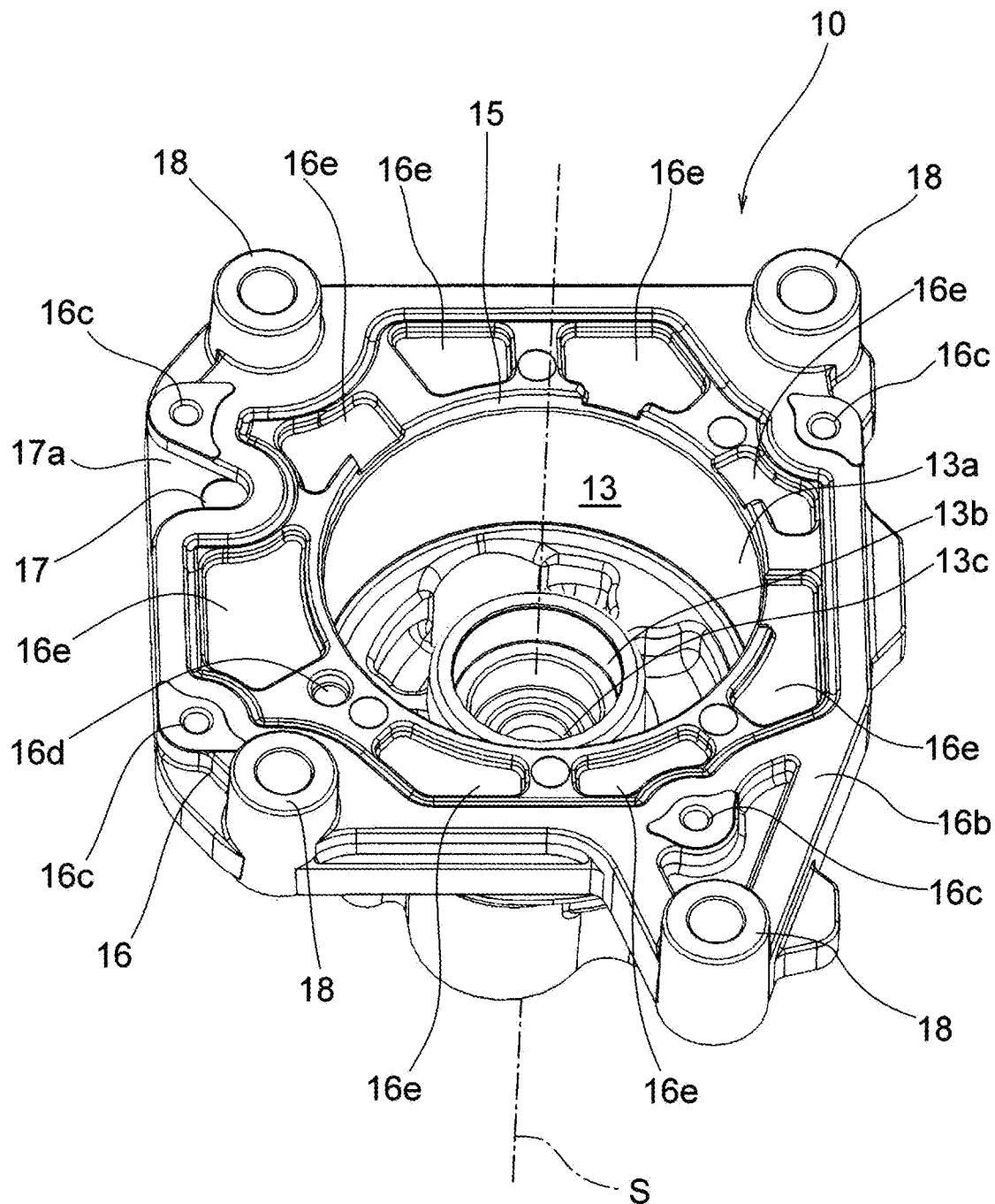
FIG. 10 is a perspective view illustrating the appearance of the housing body included in the electric device according to an embodiment.

The motor accommodation concave part 13 is a region accommodating the motor 50 and includes an inner circumferential surface 13a, an inner circumferential surface 13b, and an inner circumferential surface 13c, as shown in FIGS. 10 and 11.

The inner circumferential surface 13a is formed as a cylindrical surface with the axis S as the center, so as to fit and fix a stator 51 of the motor 50.

The inner circumferential surface 13b is formed as a cylindrical surface with the axis S as the center, so as to fit and fix a bearing $B_1$ rotatably supporting a driving shaft 53 of the motor 50. The inner circumferential surface 13c is formed as a cylindrical surface with the axis S as the center, so as to fit and fix a lip-shaped seal member Sr sealing around the driving shaft 53.

The partition wall part 14 is formed to partition the pump accommodation concave part 11 and the motor accommodation concave part 13, and includes an insertion hole 14a with the axis S as the center.

The insertion hole 14a is formed as a cylindrical surface with the axis S as the center, so that the driving shaft 53 of the motor 50 is rotatably inserted into the insertion hole 14a.

The fitting concave part 15 is formed as a cylindrical surface with the axis S as the center in an outer end region of the motor accommodation concave part 13. In addition, a fitting convex part 22 of the holder cover 20 is fit with the fitting concave part 15. That is, by fitting the fitting convex part 22 of the holder cover 20 with the fitting concave part 15 of the housing body 10, the center of a bearing cylindrical part 23 formed in the holder cover 20 is positioned to be coaxial with the axis S of the housing body 10.

As shown in FIGS. 3, 4, 10, and 11, the flange part 16 is formed to protrude in a plate shape in a direction perpendicular to the axis S from a wall part 13d defining the motor accommodation concave part 13. In addition, the flange part 16 includes a bonding surface 16a, a bonding surface 16b, four screw holes 16c, one concave part 16d, and eight thinned portions 16c.

The bonding surface 16a is formed as a flat surface perpendicular to the axis S, so that the bonding part 1a of the application target 1 is bonded. In addition, an annular groove 16a1 with which a sealing member SR3 interposed with respect to the bonding part 1a is formed on the bonding surface 16a. The sealing member SR3 is an O-ring formed by a rubber material.

The bonding surface 16b is formed as a flat surface perpendicular to the axis S, so that the holder cover 20 is bonded by sandwiching the seal member $SR_1$.

The screw holes 16c are holes screwed into by the fastening bolts 100 with respect to the housing body 10. The fastening bolts 100 fasten the outer cover 30 in a state in which the holder cover 20 is sandwiched.

The concave part 16d is formed as a cylindrical hole and receives the tip end side of a fastening screw 80a of six fastening screws 80, and receives an end of the coil spring 90 to be seated and exerts limitation so that the position of the coil spring 90 is not offset in a direction perpendicular to the axis S.

The eight thinned parts 16e are thinned to a predetermined depth from the bonding surface 16b toward the direction of the axis S, and five thinned parts 16e receive, in a contactless manner, the tip end side of five fastening screws 80 in an assembled state.

The through hole 17 is formed as a cylindrical hole expanding in parallel with the axis S in the flange part 16, so that a cylindrical part 26b formed in the holder cover 20 is inserted halfway with a gap left. In addition, on the periphery of the through hole 17, a thinned part 17a recessed from the bonding surface 16b in the direction of the axis S is formed. In addition, in the assembled state, the internal space in which the circuit substrate 70 is disposed serves as a ventilation hole in communication with the outside via the through hole 17 and the thinned part 17a.

The boss part 18 includes a circular hole for an installation bolt (not shown) to pass through. The installation bolt is provided to install the housing body 10 to the bonding part 1a of the application target 1.

The holder cover 20 is bonded to the housing body 10, so as to cover the motor 50 accommodated in the motor accommodation concave part 13 of the housing body 10 and hold a portion of the motor 50 (the driving shaft 53 via a bearing $B_2$). In addition, the holder cover 20 is formed by using a non-conductive material, such as a resin material.

As shown in FIGS. 3, 4, 12, and 13, the holder cover 20 includes a bonding surface 21, the fitting convex part 22, the bearing cylindrical part 23, an opening part 24, a bonding surface 25, a ventilation part 26, six boss parts 27, four circular holes 28, and a connector part 29.

The bonding surface 21 is formed as a flat surface perpendicular to the axis S, so that the bonding surface 16b of the housing 10 is bonded by sandwiching the seal member $SR_1$. In addition, on the bonding surface 21, an annular groove 21a and nut accommodation concave parts 21b are formed. In the annular groove 21a, the seal member $SR_1$ is accommodated. In addition, the nut accommodation concave parts 21b non-rotatably accommodate the nuts 81 in a region on the inner side with respect to the annular groove 21a.

The seal member $SR_1$ is an annular molded rubber formed by a rubber material or a liquid seal agent injected at the time of bonding.

The nut accommodation concave part 21b is formed as a hexagonal hole, completely accommodates the nut 81, and is formed to receive the other end of the coil spring 90 in the assembled state.

The fitting convex part 22 is formed as eight protrusion pieces arranged at equal intervals in the circumferential direction with the axis S as the center, so as to be fit with the fitting concave part 15 of the housing body 10 and position the center of the bearing cylindrical part 23 on the axis S.

The bearing cylindrical part 23 is formed by press-fitting a metallic molded article defining a cylindrical surface with the axis S as the center, so as to fit and fix the bearing $B_2$ supporting the driving shaft 53 of the motor 50.

Figure 9:
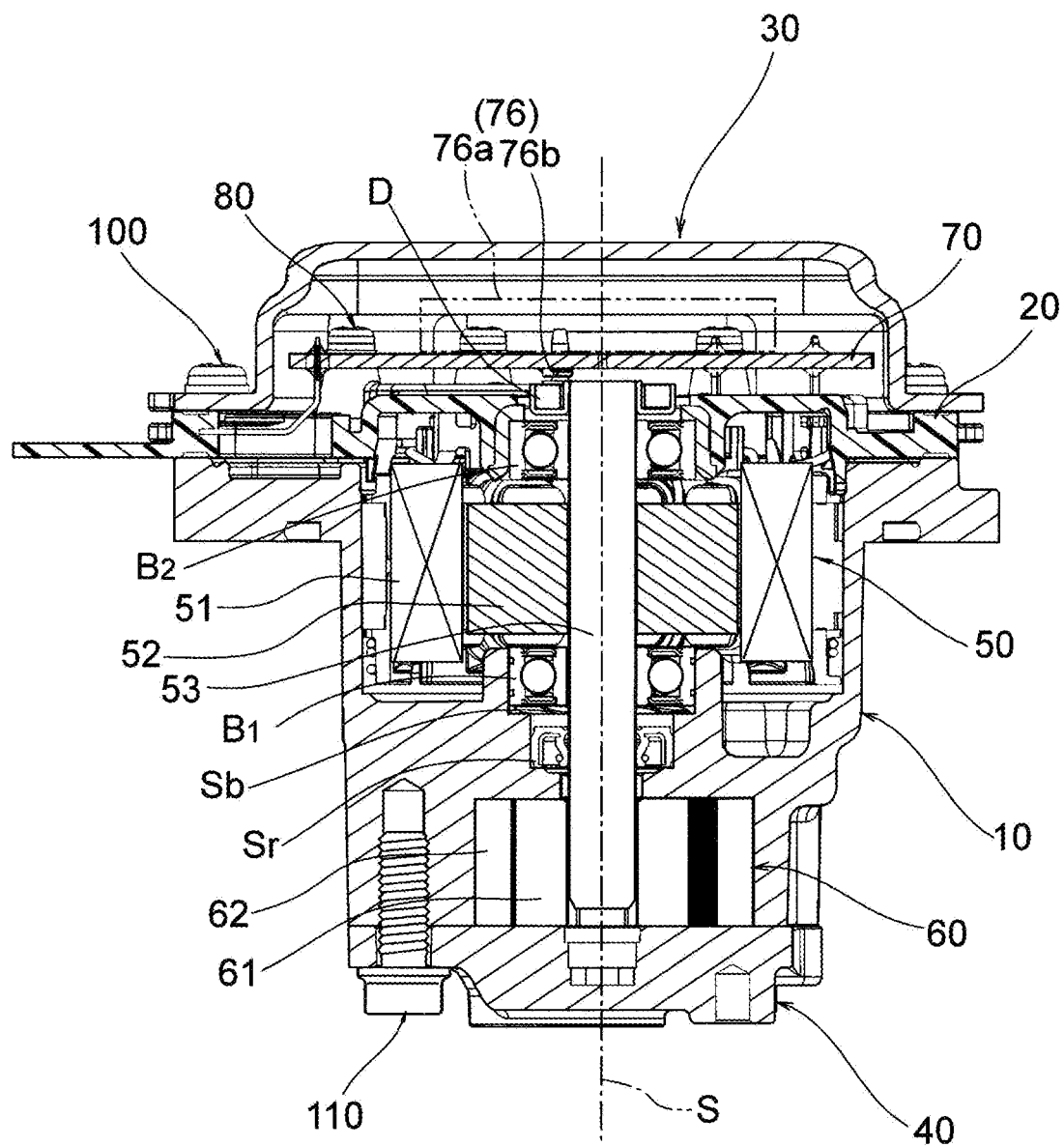
FIG. 9 is a cross-sectional view taken along a surface passing through the axis of the driving shaft in the electric device according to an embodiment.

The opening part 24 is formed as a circular hole open to be coaxial with the bearing cylindrical part 23, so that a detected part D provided at an end of the driving shaft 53 is opposed to a detection sensor 76b (see FIG. 9) provided on the circuit substrate 70.

The bonding surface 25 is formed as a flat surface perpendicular to the axis S, so that the bonding surface 31 of the outer cover 30 is bonded by sandwiching a seal member $SR_2$. In addition, on the bonding surface 25, an annular groove 25a where the seal member SR₂ is disposed and two positioning pins 25b for positioning the outer cover 30 are formed.

The seal member SR₂ is an annular molded rubber formed by a rubber material or a liquid seal agent injected at the time of bonding.

Figure 6:
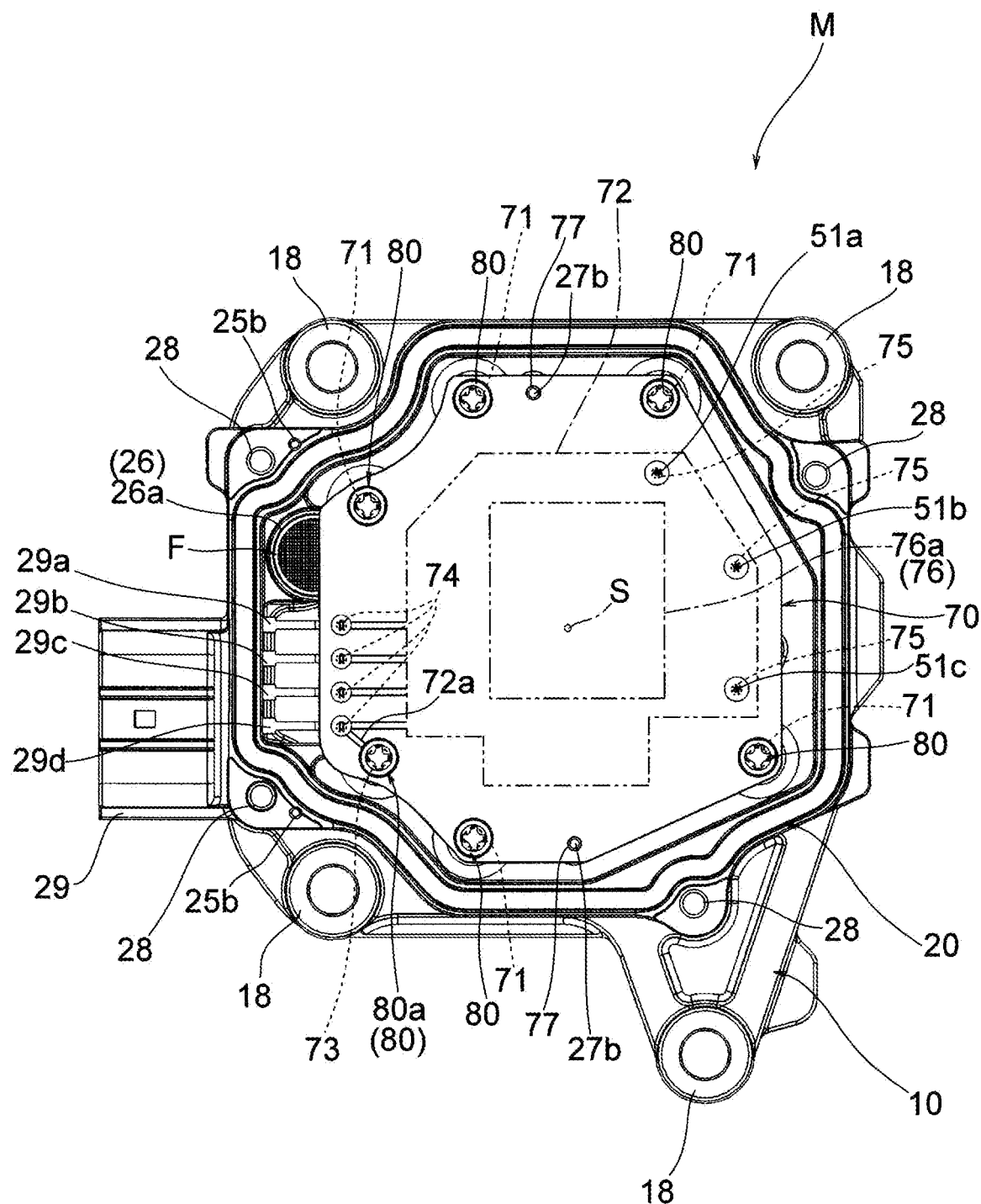
FIG. 6 is a plan view illustrating a state in which the outer cover is removed in the electric device according to an embodiment.
Figure 12:
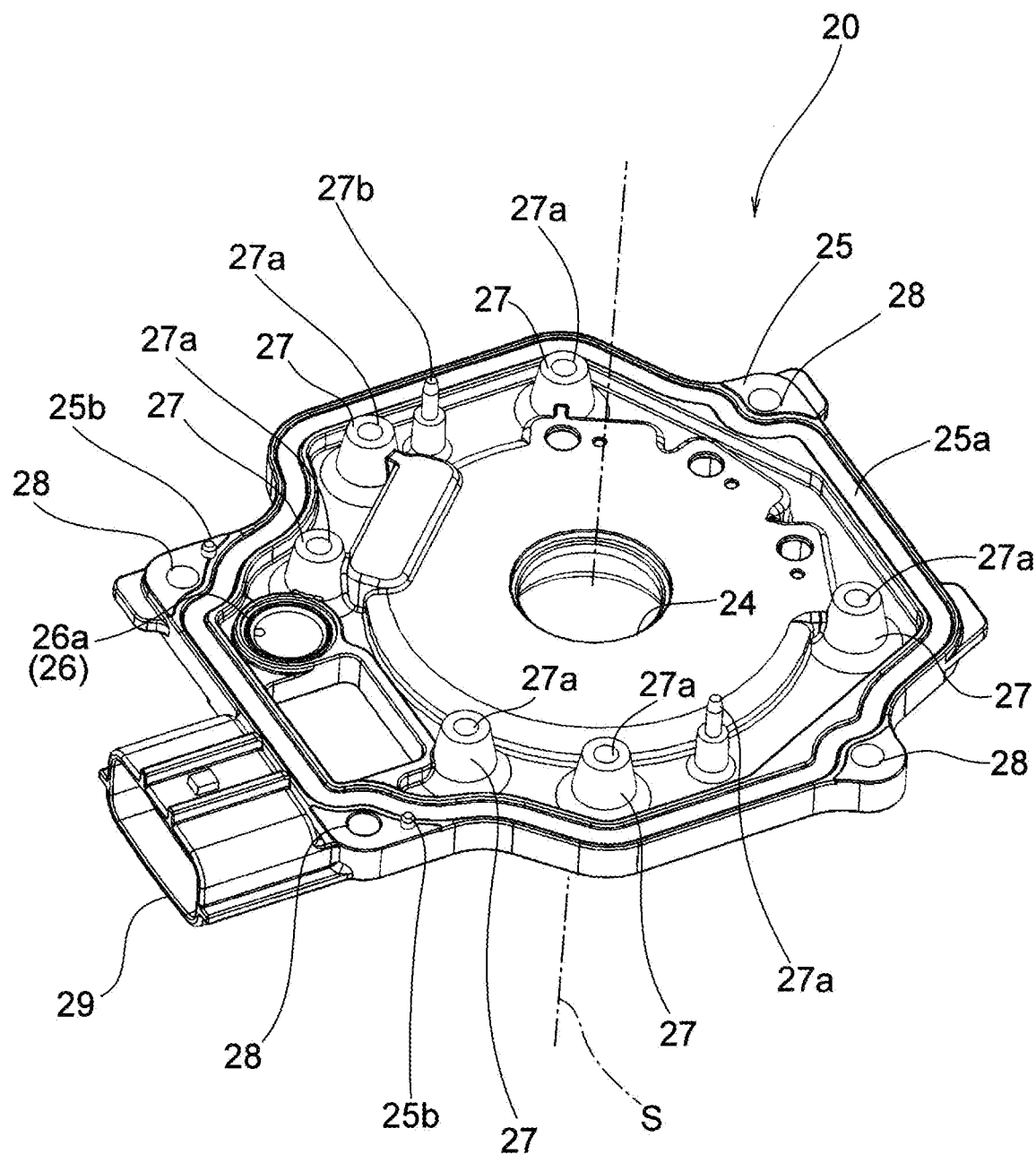
FIG. 12 is a perspective view illustrating the appearance of a holder cover included in the electric device according to an embodiment when viewed from an outer side.
Figure 13:
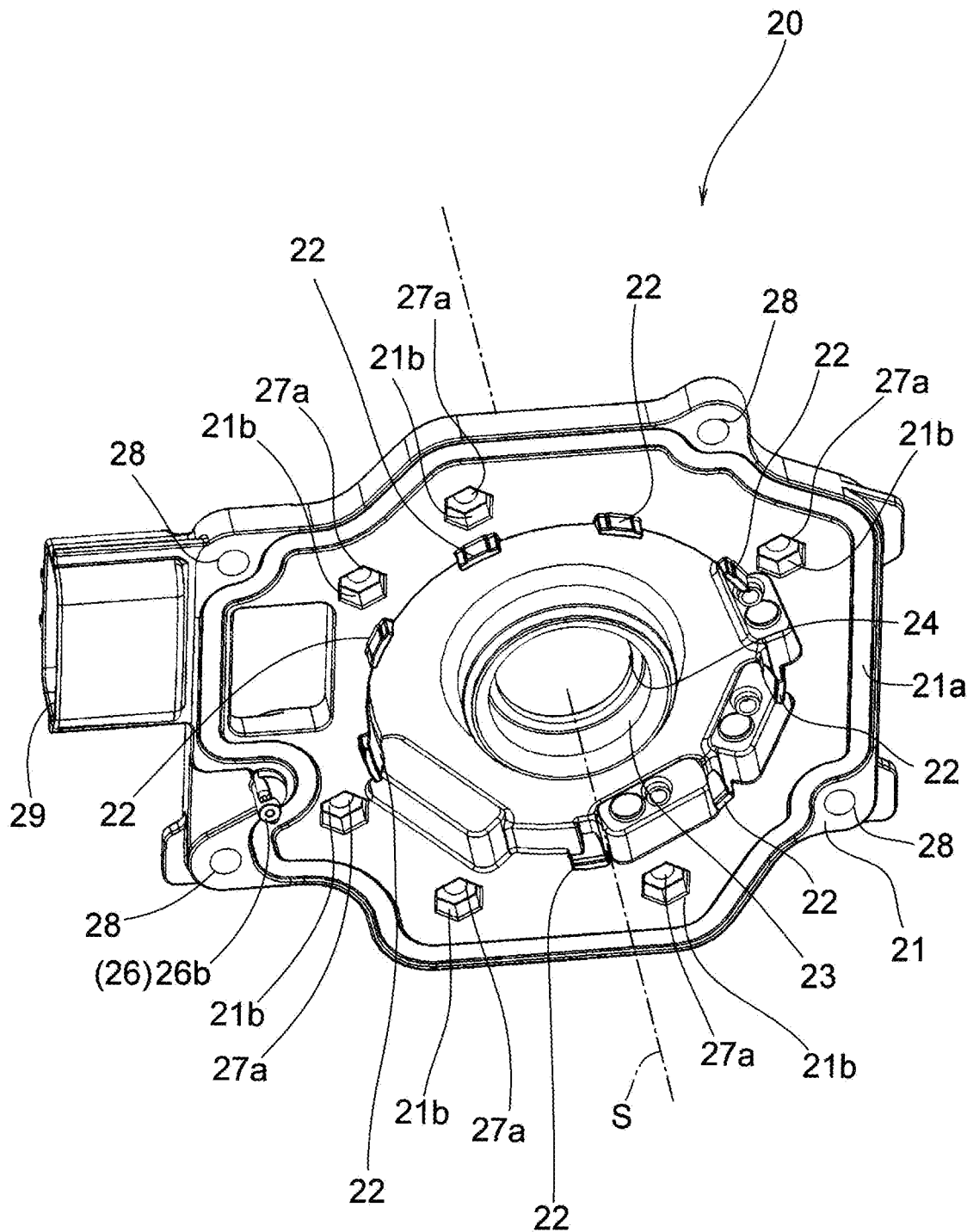
FIG. 13 is a perspective view illustrating the appearance of a holder cover included in the electric device according to an embodiment when viewed from an inner side.
Figure 14:
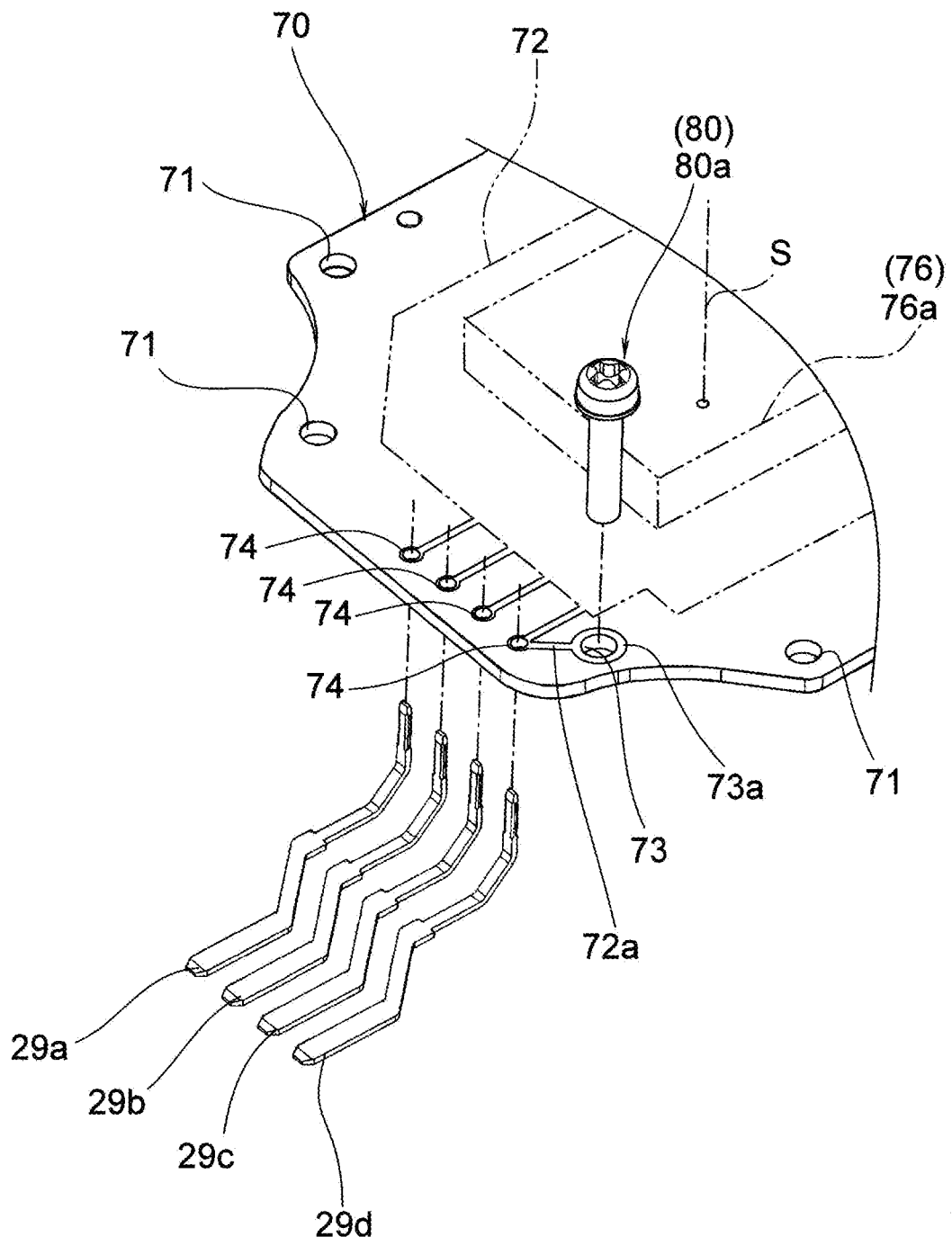
FIG. 14 is an exploded perspective view illustrating a connection relationship among the fastening screw, a conductive pattern on the circuit substrate, and a grounding terminal in the electric device according to an embodiment.

The ventilation part 26 serves as a ventilation hole for communication of the internal space where the circuit substrate 70 is accommodated with the outside. As shown in FIGS. 6, 12, and 13, the ventilation part 26 has an annular concave part 26a and a cylindrical part 26b. The annular concave part 26 defines an outer edge part where a waterproof ventilation film F in a disc shape is disposed in a region on the inner side with respect to the bonding surface 25. The cylindrical part 26b defines a passage for communication from the annular concave part 26a to the outside.

Each of the six boss parts 27 defines a circular hole 27a holding the circuit substrate 70 and allowing the fastening screw 80 fastening the circuit substrate 70 to pass through. In the vicinities of two of the boss parts 27, two positioning pins 27b for positioning the circuit substrate 70 are formed.

The four through holes 28 are holes allowing the fastening bolts 100 fastening the outer cover to the housing body 10 to pass through.

The connector part 29 is provided for connection with the outside, accommodates three driving terminals 29a, 29b, 29c and one grounding terminal 29d connected with the conductive pattern 72 of the circuit substrate 70 and holds these terminals by embedding intermediate regions of the terminals.

The outer cover 30 covers the circuit substrate 70 provided on the outer side of the holder cover 20 and is formed by using a conductive material, such as an aluminum material. As shown in FIGS. 3, 4, 5, and 9, the outer cover 30 includes a bonding surface 31, an accommodation part 32, four circular holes 33, and two positioning holes 34. The bonding surface 31 is bonded to the bonding surface 25 of the holder cover 20. The accommodation part 32 accommodates the circuit substrate 70. The fastening bolts 100 pass through the four circular holes 33. The positioning pins 27b are fit with the two positioning holes 34.

In addition, in the outer cover 30, in a state in which the circuit substrate 70 and the water-proof ventilation film F are installed to the holder cover 20, the bonding surface 31 is bonded to the bonding surface 25 of the holder cover 20 by sandwiching the seal member SR₂, and is fastened and fixed to the housing body 10 by using the fastening bolts 100.

Figure 4:
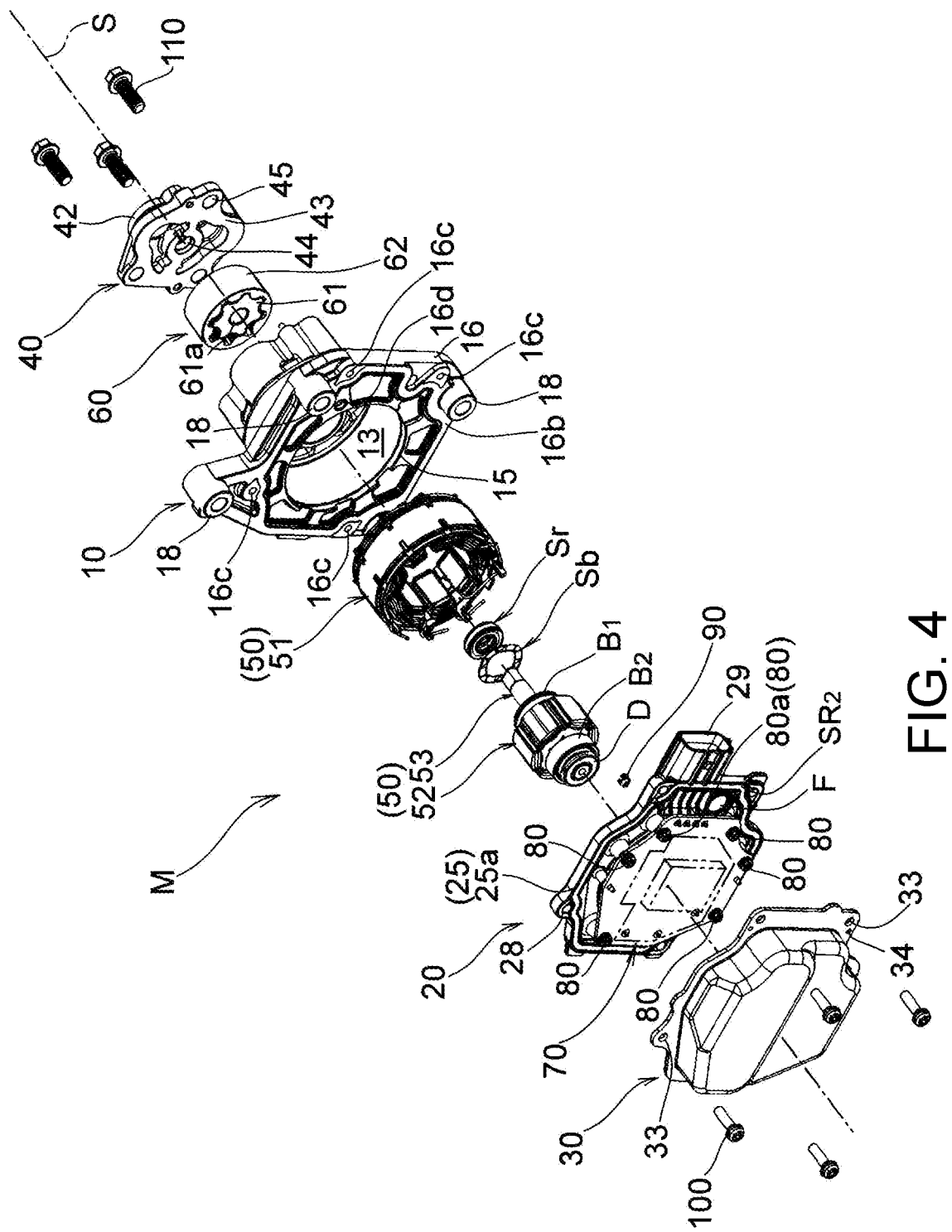
FIG. 4 is an exploded perspective view in which the electric device according to an embodiment is dissembled and viewed from an outer cover side.
Figure 5:
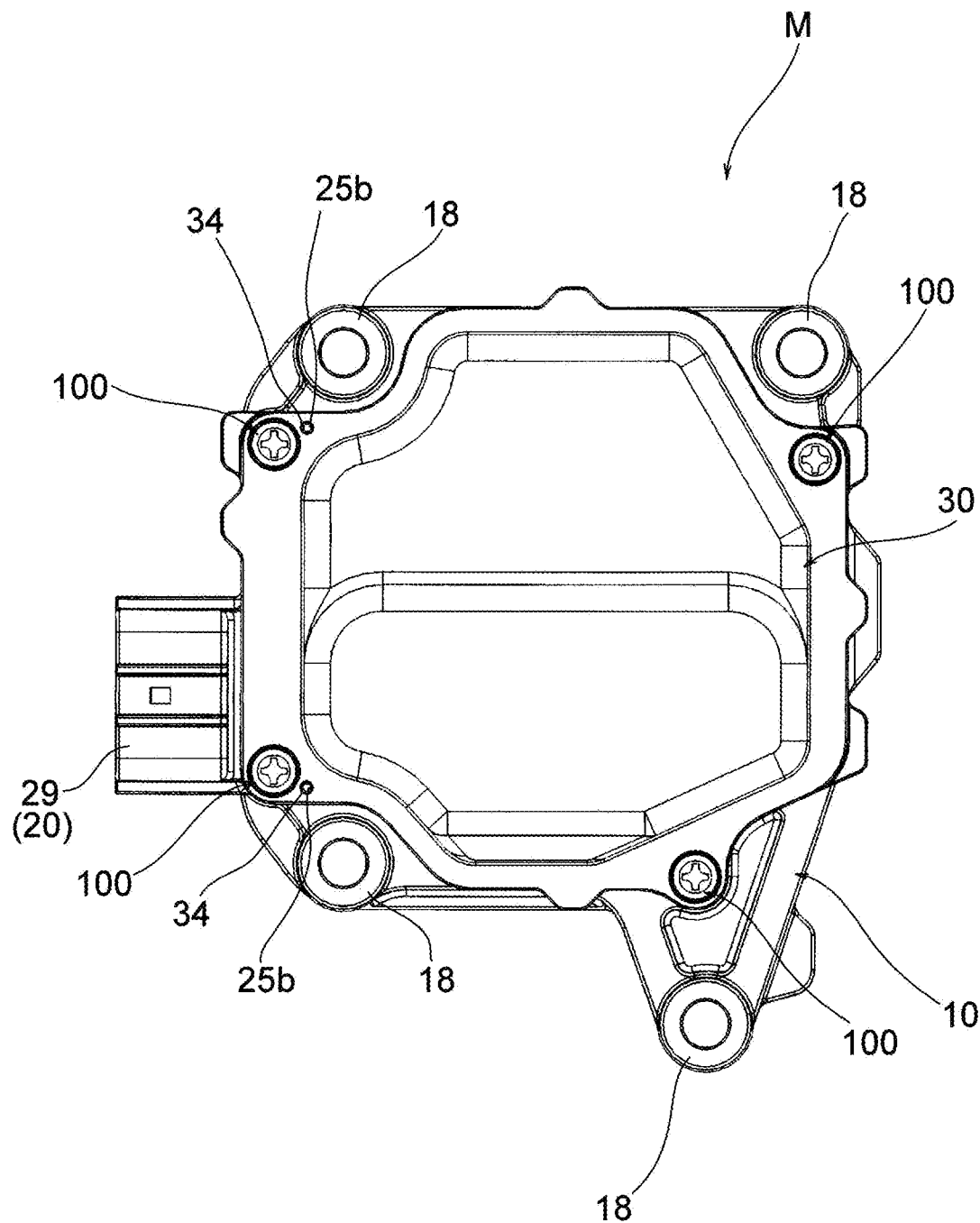
FIG. 5 is a plan view in which the electric device according to an embodiment is viewed from the outer cover side.

The pump cover 40 is bonded to the housing body 10 to cover the pump accommodation concave part 11 of the housing body 10, and is formed in a plate shape by using a conductive material such as steel, cast iron, sintered iron, aluminum alloy, etc. As shown in FIGS. 3 and 4, the pump cover 40 includes a cylindrical part 41, a cylindrical part 42, an inner wall surface 43, a central concave part 44 receiving the tip end of the driving shaft 53, and three circular holes 45 through which the fastening bolts 110 pass.

The cylindrical part 41 defines a suction passage 41a sucking in the hydraulic oil, and is disposed in a storage part 1c of the application target 1.

The cylindrical part 42 defines a discharge passage 42a discharging the hydraulic oil, and is fit with the guide passage 1d of the application target 1.

The inner wall surface 43 slidably receives an end surface on the outer side of the pump unit 60 (the inner rotor 61 and the outer rotor 62) accommodated in the pump accommodation concave part 11.

In addition, in the pump cover 40, in the state in which the pump accommodation concave part 11 accommodates the pump unit 60, the inner wall surface 43 is bonded to the bonding surface 12 of the housing body 10 and fastened and fixed to the housing body 10 by using the fastening bolts 110. The fastening bolt 110 is formed by a conductive metallic material.

As shown in FIGS. 3 and 4, the motor 50 is a three-phase brushless motor including the stator 51, a rotor 52, and the driving shaft 53.

The stator 51 includes a stator core, a bobbin, and a coil. The stator core is formed by using a steel plate formed by a magnetic material. The bobbin is formed by a resin material having an electrically insulating property. The coil is wound around the bobbin.

The rotor 52 includes a rotor core formed by using a steel plate formed by a magnetic material and a permanent magnet fit into the rotor core.

The driving shaft 53 is formed in a cylindrical columnar shape extending in the direction of the axis S by using a steel material, etc., and is fit with the rotor 52 so as to rotate integrally with the rotor 52. Also, on the two sides sandwiching the rotor 52, one side of the driving shaft 53 is supported by the bearing B₁ fixed to the housing body 10, and the other side of the driving shaft 53 is supported by the bearing B₂ fixed to the holder cover 20, so that the driving shaft 53 is supported to be rotatable about the axis S.

In addition, a region of the driving shaft 53 on the tip end side with respect to the bearing B₁ is fit with the fitting hole 61a of the inner rotor 61, so as to transmit a rotational driving force to the pump unit 60.

In addition, in the driving shaft 53, on the outer circumferential region between the bearing B₁ and the insertion hole 14a, the lip-shaped seal member Sr is disposed, and the driving shaft 53 is sealed, so that the hydraulic oil does not flow from the side of the pump accommodation concave part 11 toward the motor accommodation concave part 13, or air, etc., is not sucked in from the side of the motor accommodation concave part 13 toward the side of the pump accommodation concave part 11.

The pump unit 60 is disposed in the pump accommodation concave part 11, so as to apply a pump effect of sucking, pressurizing, and discharging the hydraulic oil. As shown in FIGS. 3, and 4, the pump unit 60 is a trochoid pump including the inner rotor 61 and the outer rotor 62.

The inner rotor 61 is formed as an external gear having a tooth profile of a trochoid curve by using a metallic material such as steel or sintered steel. In addition, the inner rotor 61 includes an end surface sliding on the bottom surface of the housing body 10, an end surface sliding on the inner wall surface 43 of the pump cover 40, a fitting hole 61a for fitting of the driving shaft 53, and a tooth row on the outer circumference. In addition, the inner rotor 61 rotates integrally with the driving shaft 53 with the axis S as the center.

The outer rotor 62 is formed as an internal gear having a tooth profile that can be engaged with the inner rotor 61 by using a metallic material such as steel or sintered steel. In addition, the outer rotor 62 has an end surface sliding on the bottom surface 11b of the housing body 10, the end surface sliding on the inner wall surface 43 of the pump cover 40, a cylindrical outer circumferential surface in slidable contact with the inner circumferential surface 11a, and an tooth row on the inner circumference.

In addition, the outer rotor 62 rotates in the same direction with the inner rotor 61 with an axis offset from the axis S as the center at a speed slower than the inner rotor 61 while being linked with the rotation of the inner rotor 61 rotating with the axis S as the center. In addition, with the inner rotor 61 and the outer rotor 62 being partially engaged with each other, a pump effect of sucking, pressurizing, and discharging is generated continuously between the inner rotor 61 and the outer rotor 62.

As shown in FIGS. 4, 6, 7, and 14, the circuit substrate 70 is formed in a plate shape, and includes five circular holes 71 through which the fastening screws 80 pass, the conductive pattern 72 printed on one or both surfaces, one through hole 73 connected with the conductive pattern 72, four through holes 74 connected with the conductive pattern 72, three through holes 75 connected with the conductive pattern 72, a control unit 76 mounted on two surfaces on the inner side and the outer side and exerting driving control on the motor 50, and two positioning holes 77 into which the positioning pins 27b are inserted.

The conductive pattern 72 defines a print wire electrically connected with the control circuit 76 and a print wire electrically connected with the through holes 73, 74, 75, etc.

A conductive pattern 72a as a portion of the conductive pattern 72 serves as a portion of a grounding path for removing the static electricity charged to the housing body 10.

The fastening screw 80a of the eight fastening screws 80 is inserted into and electrically connected with the through hole 73, and includes an annular land 73a formed at an end.

The driving terminals 29a, 29b and 29c and the grounding terminal 29d are respectively inserted into and electrically connected with the four through holes 74.

Three terminals 51a, 51b, 51c are respectively inserted into and electrically connected with the three through holes 75.

The control unit 76 includes various electronic components 76a mounted on both surfaces and the detection sensor 76b on the inner surface opposed to the opening part 24 of the holder cover 20. The detection sensor 76b detects the rotation position of the rotor 52, and includes three Hall elements opposed to the detected part D in the direction of the axis S and arranged in an arc shape with the axis S as the center.

The fastening screws 80 are formed by a conductive material, such as a metallic material like steel, steel alloy, aluminum alloy, etc. The nut 81 is formed in a substantially hexagonal shape by also using a conductive material, such as a metallic material like steel, steel alloy, aluminum alloy, etc., and is non-rotatably fit with the nut accommodation concave part 21b of the holder cover 20.

In addition, the five fastening screws 80 are screwed into the nuts 81 in the nut accommodation concave parts 21b through the circular holes 71 of the circuit substrate 70 in a state in which the circuit substrate 70 abuts against the boss parts 27 of the holder cover 20, so as to fasten the circuit substrate 70 to the holder cover 20.

Figure 7:
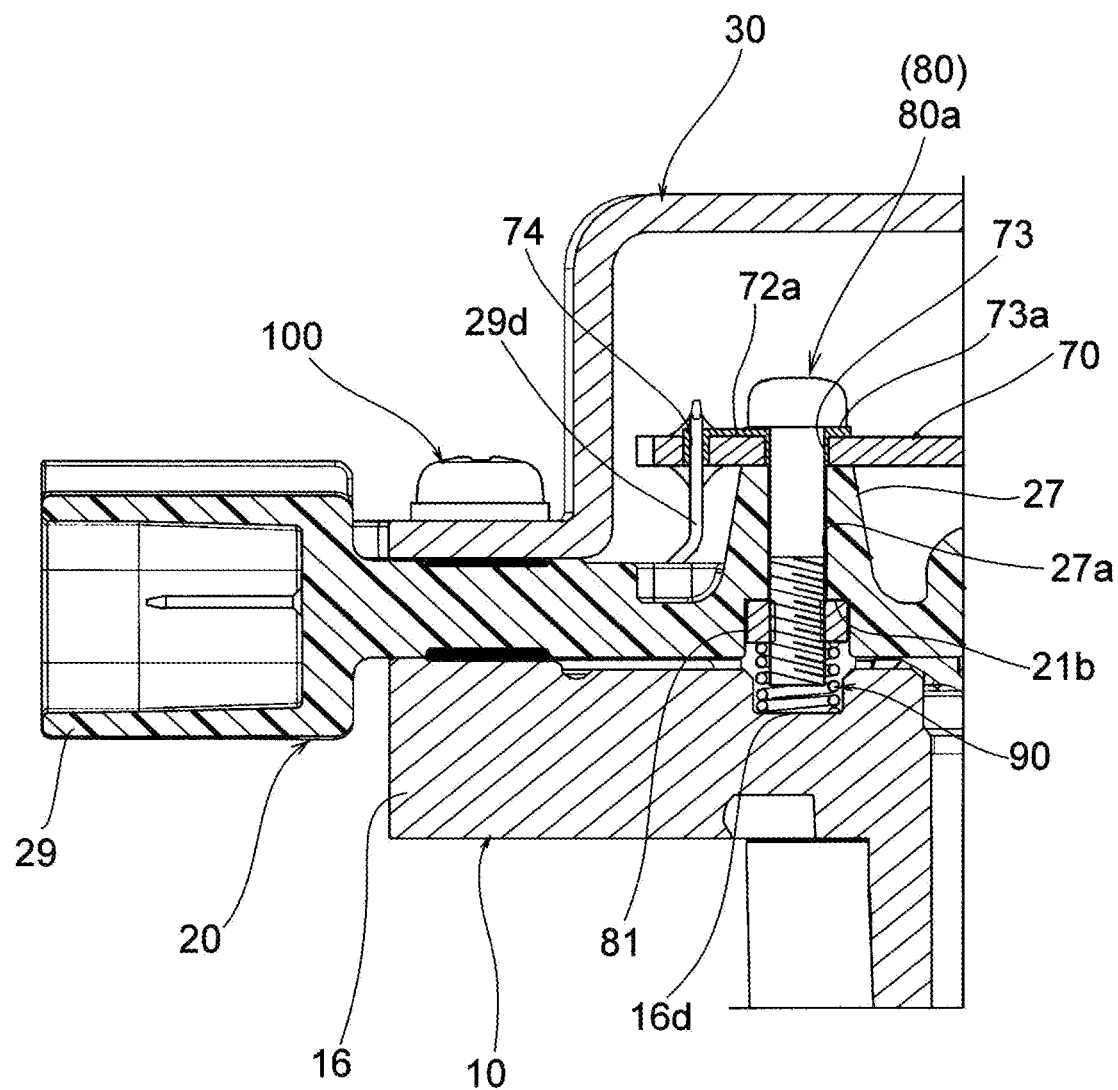
FIG. 7 is a cross-sectional view taken along a surface parallel to an axis of a driving shaft and passing through one fastening screw fastening a circuit substrate in the electric device according to an embodiment.

In addition, as shown in FIG. 7, one of the fastening screws 80, i.e., the fastening screw 80a disposed at a position closest to the grounding terminal 29d, is screwed to into the nut 81 fit with the nut accommodation concave part 21b through the through hole 73 of the circuit board 70, and the head part thereof is in close contact with the annular land 73a continuous in the end of a through hole 83, in the state in which the circuit substrate 70 abuts against the boss parts 27 of the holder cover 20.

That is, the fastening screw 80a forms a portion of the grounding path for removing the static electricity charged to the housing body 10 on the periphery of the motor 50, and is electrically connected with the grounding terminal 29d through the through hole 73 and/or the annular land 73a and the conductive pattern 72a. It may also be that the through hole 73 is formed simply like the circular hole 71, and the fastening screw 80a and the grounding terminal 29d are electrically connected only by the conductive pattern 72a and the annular land 73a.

The coil spring 90 is a compression type coil spring, and is formed by a conductive material, such as spring steel. In addition, as shown in FIG. 7, the coil spring 90 is disposed in a state in which an end is seated in the concave part 16d of the housing body 10 and the other end abuts against the nut 81 screwed with the fastening screw 80a, that is, a state of being compressed between the concave part 16d and the nut 81. Accordingly, the coil spring 90 serves as a portion of the grounding path removing the static electricity charged to the housing body 10, and the fastening screw 80a is electrically connected with the housing body 10 via the coil spring 90 and the nut 81.

Figure 8:
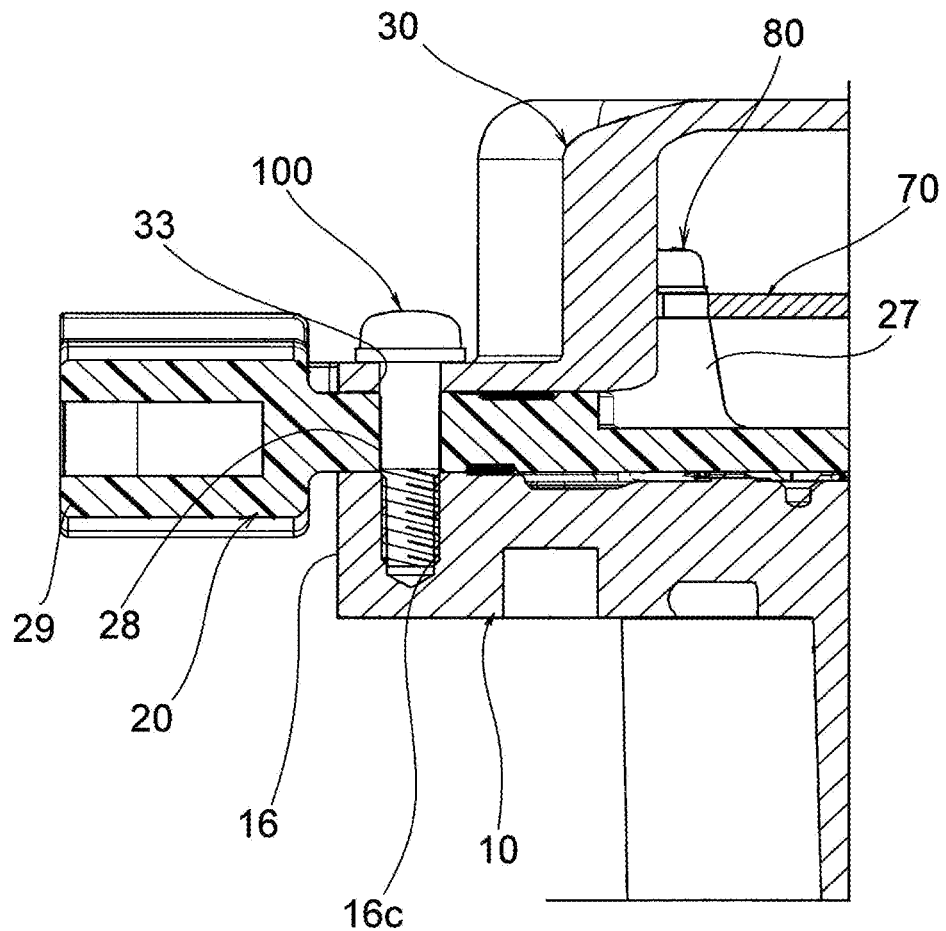
FIG. 8 is a cross-sectional view taken along a surface parallel to the axis of the driving shaft and passing through one fastening screw fastening the outer cover in the electric device according to an embodiment.

The fastening bolts 100 are formed by a conductive material, such as a metallic material like steel, steel alloy, aluminum alloy, etc. In addition, as shown in FIG. 8, the fastening bolts 100 are screwed into the screw holes 16c through the circular holes 33 in a state in which the coil spring 90, the seal member $SR_1$, the holder cover 20 to which the circuit substrate 70 is fixed, the seal member $SR_2$, and the outer cover 30 are disposed with respect to the housing body 10.

That is, the outer cover 30 is formed by a conductive material, and is fastened to the conductive housing body 10 through the conductive fastening bolts 100. Accordingly, it is assumed that, in the case in which static electricity is charged to the outer cover 30, such static electricity flows to the housing body 10 through the fastening bolts 100.

Then, an assembling process of the electric device M according to an embodiment is described.

Before assembling, the housing body 10, the bolder cover 20 holding the three driving terminals 29a, 29b, 29c and one grounding terminal 29d, the outer cover 30, the pump cover 40, the motor 50 (the stator 51, the rotor 52, the driving shaft 53), the pump unit 60 (the inner rotor 61, the outer rotor 62), the circuit substrate 70 in which the conductive pattern 72 is printed and the control unit 76 (various electronic components, etc.) is mounted, the water-proof ventilation film F, the bearings $B_1$, $B_2$, a wave-shaped spring Sb as a thrust bearing, the lip-shaped seal member Sr, the seal members $SR_1$, $SR_2$, the fastening screws 80, the coil spring 90, and the fastening bolts 100, 110 are prepared.

In advance, in a sub-assembly process, the driving shaft 53 is fit with and fixed to the rotor 52, and the bearings $B_1$, $B_2$ and the detected part D are assembled to the driving shaft 53. In addition, in the holder cover 20, the circuit substrate 70 is disposed, the three driving terminals 29a, 29b, 29c and the grounding terminal 29d are respectively inserted into and soldered to the through holes 74, the circuit substrate 70 is fixed by using the fastening screws 80 and the nuts 81, and the water-proof ventilation film F is fixed to the outer edge part of the annular concave part 26a of the ventilation part 26 by using an adhesive, etc.

Moreover, in a main assembly process, firstly, the motor 50 is assembled to the motor accommodation concave part 13 of the housing body 10. Specifically, the lip-shaped seal member Sr is fit with the inner circumferential surface 13c, and the stator 51 is fit with and fixed to the inner circumferential surface 13a. Then, the driving shaft 53 with which the rotor 52 is fit and fixed is inserted so that the wave-shaped spring Sb is sandwiched between the bearing $B_1$ and the lip-shaped seal member Sr. The bearing $B_1$ installed to a side of the driving shaft 53 is fit with and fixed to the inner circumferential surface 13b, and a tip end side region of the driving shaft 53 is arranged to protrude to the pump accommodation concave part 11 through the insertion hole 14a.

Then, in the state in which the coil spring 90 is fit with the concave part 16d of the housing body 10, the holder cover 20 to which the circuit substrate 70 and the water-proof ventilation film F are installed approaches the housing body 10 from the direction of the axis S so as to cover the motor accommodation concave part 13.

Then, the tip end side of the fastening screw 80a is inserted into the other end of the coil spring 90, the other end of the coil spring 90 is pressed by the nut 81, the bearing $B_2$ installed to the other side of the driving shaft 53 is fit with the bearing cylindrical part 23, the cylindrical part 26b is inserted into the through hole 17, the fitting convex part 22 is fit with the fitting concave part 15, the bonding surface 21 is bonded to the bonding surface 16d of the housing body 10 with the seal member $SR_1$ being interposed, and the three coil terminals 51a, 51b, 51c are inserted into the through holes 75. Then, the three coil terminals 51a, 51b, 51c are soldered.

Accordingly, with the housing body 10 and the holder cover 20, the driving shaft 53 of the motor 50 is supported to be rotatable about the axis S via the bearings $B_1$, $B_2$. In addition, the fastening screw 80a is electrically connected with the housing body 10 via the coil spring 90 and the nut 81.

Then, the outer cover 30 approaches the holder cover 20 from the direction of the axis S, and the bonding surface 31 is bonded to the bonding surface 25 of the holder cover 20 with the seal member $SR_2$ being interposed, so as to cover the circuit substrate 70 and the water-proof ventilation film F. Then, the fastening bolts 100 are screwed into the screw holes 16c of the housing body 10 through the circular holes 33, 28.

Accordingly, the outer cover 30 is fixed to the housing body 10 by sandwiching the holder cover 20 and electrically connected with the housing body 10 via the fastening bolts 100.

Then, the inner rotor 61 is inserted into the pump accommodation concave part 11 of the housing body 10 and is fit with the driving shaft 53 to rotate integrally.

Then, the outer rotor 62 is inserted into the pump accommodation concave part 11 to be engaged with the inner rotor 61.

Then, the pump cover 40 approaches from the direction of the axis S to be bonded to the bonding surface 12, and is fixed to the housing body 10 by using the fastening bolts 110, so as to cover the pump accommodation concave part 11.

According to the above, the assembling of the electric device M is completed. It is noted that the assembling procedure is not limited to the above, and the electric device M may also be assembled in other procedures.

In the electric device M assembled as the above, through the coil spring 90, the fastening screw 80a and the nut 81, the through hole 73, and/or the annular land 73a, the conductive pattern 72a and the grounding terminal 29d provided at the holder cover 20 to be conductive to the conductive pattern 72a, the grounding path removing the static electricity charged to the periphery of the motor 50 as the electric part is formed.

The electric device M with the above configuration serves as an electric pump device. Therefore, when the motor 50 is properly drive-controlled to rotationally drive the pump unit 60, the hydraulic oil stored in the storage part 1c is sucked in from the suction passage 41a and pressurized, discharged from the discharge passage 42a, and supplied to the supply destination via the guide passage 1d.

When the pump operates by using electric energy, in the motor 50, static electricity is generated because of relative movement of the rotor 52 with respect to the stator 51. In addition, the generated static electricity is charged to the peripheral region of the motor 50, that is, the housing body 10.

Here, the charged static electricity is removed by being arranged to flow to the outside connected with the connector part 29 via the grounding path formed, from the housing body 10, by the coil spring 90, the nut 81 and the fastening screw 80a, the annular land 73a and/or the through hole 73, the conductive pattern 72a, and the grounding path 29d.

According to the electric device M with the above configuration, the grounding path for removing the static electricity discharged around the electric part (the motor 50) includes the conductive fastening screw 80a, the fastening screw 80a fastening the circuit substrate 70 to the holder cover 20 and being conductive to the housing body 10, the conductive pattern 72a provided at the circuit substrate 70 to be conductive to the fastening screw 80a, and the grounding terminal 29b provided at the holder cover 20 to be conductive to the conductive pattern 72a.

In this way, compared with the conventional grounding path, the grounding path can be reduced, and the noise, etc., with respect to the control unit can be suppressed from occurring, while the structure is simplified, the number of components is reduced, and the cost is reduced, etc.

In addition, the fastening screw 80a is electrically connected with the housing body 10 via the conductive coil spring 90. Therefore, compared with the case where the fastening screw 80a is directly connected with the housing body 10, the assembling error, the dimension error, etc., can be absorbed, and the conduction between the fastening screw 80a and the housing body 10 can be reliably achieved.

In addition, with the housing body 10 including the concave part 16d in which an end of the coil spring 90 is seated, the end of the coil spring 90 is fit and seated at the time of assembling. Accordingly, the coil spring 90 can be prevented from falling off, the position of the coil spring 90 can be prevented from being offset, and the assembling process is easy.

In addition, the conductive nut 81 screwed with the fastening screw 80a is adopted, the coil spring 90 is disposed between the housing body 10 (or the concave part 16d of the housing body 10) and the nut 81 in a compressed state. Accordingly, the other end of the coil spring 90 can be reliably brought into contact with respect to the nut 81, and, compared with the case of being brought into contact with the tip end of the fastening screw 80a, electrical connection can be made reliably.

In addition, since the holder cover 20 includes the nut accommodation concave part 21d non-rotatably accommodating the nut 81, the assembling of the nut 81 is simplified, and the process of screwing the fastening screw 80 (80a) is simplified.

In addition, in the case where the circuit substrate 70 is fastened to the holder cover 20 by using multiple fastening screws 80, by adopting the fastening screw disposed at a position closest to the grounding terminal 29d among the fastening screws 80 as the fastening screw 80a forming the grounding path, the grounding path can be further reduced as compared with the case of adopting other fastening screws 80.

In addition, by electrically connecting the fastening screw 80a with the conductive pattern 72a via the through hole 73 conductive to the conductive pattern 72a or the annular land 73a formed at the end of the through hole 73, the conduction between the fastening screw 80a and the conductive pattern 72a can be achieved reliably.

In addition, the outer cover 30 covering the circuit substrate 70 is formed by a conductive material and fastened to the housing body 10 by using the conductive fastening bolts 100. Accordingly, in the case where static electricity is discharged to the outer cover 30, the static electricity can flow to the housing body 10 through the fastening bolts 100 and be removed.

In addition, a driven body (the pump unit 60) driven by the driving shaft 53 of the motor 50 as the electric part is provided, the housing body 10 includes a driven body accommodation concave part (the pump accommodation concave part 11) accommodating the driven body (the pump unit 60), and the conductive driven body cover (the pump cover 40) is bonded to the housing body 10 to cover the driven body accommodation concave part (the pump accommodation concave part 11). In this way, even if static electricity is charged to the driven body cover (the pump cover 40), the static electricity may flow to the housing body 10. Therefore, the static electricity can be removed through the grounding path.

Although the motor 50 is shown as the electric part in the embodiment, the invention is not limited thereto. A reciprocating actuator or other operating modules are applicable as long as the electric part is an electric part operated electrically.

In the embodiment, the pump unit 60 accommodated in the pump accommodation part 11 of the housing body 10 is shown as the driven body driven by the motor 50. However, the invention is not limited thereto. A deceleration device or other mechanisms may also be adopted.

In the embodiment, a configuration in which the nuts 81 to which the fastening screws 80 are screwed are adopted. However, the invention is not limited thereto. It may also be that a configuration of fixing the circuit substrate 70 by forming female screw holes on the holder cover and directly screwing fastening screws into the female screw holes is adopted and the tip end side of one fastening screw is brought into direct contact with the coil spring 90 for electrical connection, or the coil spring 90 is abandoned and the fastening screw is directly connected electrically with the housing body.

According to the above, with the electrical device of the invention, the grounding path can be reduced, and the noise, etc., with respect to the control unit can be suppressed from occurring, while the structure is simplified, the number of components is reduced, and the cost is reduced, etc. Therefore, in addition to being applicable as an electric pump device, the electrical device of the invention may also be used as an electric deceleration device, an electric actuator device, or other electric apparatuses having a function other than a pump.

What is claimed is:

1. An electric device, comprising:
an electric part, operating electrically;
a housing body, being conductive and accommodating the electric part;
a holder cover, covering the electric part accommodated in the housing body and being non-conductive and bonded to the housing body, so as to hold a portion of the electric part;
a circuit substrate, which is disposed on an outer side of the holder cover and on which a control unit exerting driving control on the electric part is mounted; and
a grounding path, removing static electricity charged to a periphery of the electric part,
wherein the grounding path comprises: a fastening screw, fastening the circuit substrate to the holder cover and being conductive to the housing body; a conductive pattern, provided in the circuit substrate and being conductive to the fastening screw; and a grounding terminal, provided in the holder cover and being conductive to the conductive pattern.

2. The electric device as claimed in claim 1, wherein the fastening screw is electrically connected with the housing body via a coil spring that is conductive.

3. The electric device as claimed in claim 2, wherein the housing body comprises a concave part in which an end of the coil spring is seated.

4. The electric device as claimed in claim 2, comprising a nut, being conductive and screwed onto the fastening screw,
wherein the coil spring is disposed in a compressed state between the housing body and the nut.

5. The electric device as claimed in claim 3, comprising a nut, being conductive and screwed onto the fastening screw,
wherein the coil spring is disposed in a compressed state between the concave part of the housing body and the nut.

6. The electric device as claimed in claim 5, wherein the holder cover comprises a nut accommodation concave part non-rotatably accommodating the nut.

7. The electric device as claimed in claim 1, wherein the circuit substrate is fastened to the holder cover by using a plurality of fastening screws, and
the fastening screw forming the grounding path is a fastening screw disposed at a position closest to the grounding terminal among the fastening screws.

8. The electric device as claimed in claim 1, wherein the fastening screw is electrically connected with the conductive pattern via a through hole conductive to the conductive pattern or an annular land formed at an end of the through hole.

9. The electric device as claimed in claim 1, wherein an outer cover is bonded to the holder cover to cover the circuit substrate.

10. The electric device as claimed in claim 9, wherein the outer cover is formed by a conductive material and is fastened to the housing body by using a fastening bolt that is conductive.

11. The electric device as claimed in claim 1, wherein the electric part is a motor that generates a rotational driving force,
the electric device comprises a driven body driven by a driving shaft of the motor, and
the housing body comprises a driven body accommodation concave part accommodating the driven body.

12. The electric device as claimed in claim 11, wherein a driven body cover that is conductive is bonded to the housing body, so as to cover the driven body accommodation concave part.

13. The electric device as claimed in claim 11, wherein the driven body is a pump unit that causes a fluid to flow, and the driven body accommodation concave part is a pump accommodation concave part.

14. The electric device as claimed in claim 13, wherein the pump unit comprises a trochoid pump comprising an inner rotor and an outer rotor, the inner rotor being rotated by the driving shaft, and the outer rotor being linked with the inner rotor.

15. The electric device as claimed in claim 13, wherein a pump cover that is conductive is bonded to the housing body to cover the pump accommodation concave part.

16. The electric device as claimed in claim 15, wherein the pump cover comprises a suction passage and a discharge passage, the suction passage sucking in the fluid, and the discharge passage discharging the fluid.

* * * * *